(12) United States Patent
de Frésart et al.

(10) Patent No.: US 6,828,650 B2
(45) Date of Patent: Dec. 7, 2004

(54) BIPOLAR JUNCTION TRANSISTOR STRUCTURE WITH IMPROVED CURRENT GAIN CHARACTERISTICS

(75) Inventors: Edouard de Frésart, Tempe, AZ (US); Patrice Parris, Phoenix, AZ (US); Richard J De Souza, Tempe, AZ (US); Jennifer H. Morrison, Chandler, AZ (US); Moaniss Zitouni, Gilbert, AZ (US); Xin Lin, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/160,940

(22) Filed: May 31, 2002

(65) Prior Publication Data

US 2003/0222329 A1 Dec. 4, 2003

(51) Int. Cl.[7] ............................................. H01L 29/00
(52) U.S. Cl. ...................... 257/518; 257/378; 257/514; 257/565
(58) Field of Search ................................. 257/378, 514, 257/518, 565, 162, 256

(56) References Cited

U.S. PATENT DOCUMENTS

| | | | | |
|---|---|---|---|---|
| 3,873,989 A | * | 3/1975 | Schinella et al. | ............ 257/162 |
| 4,283,236 A | * | 8/1981 | Sirsi | ............................ 438/335 |
| 4,669,177 A | * | 6/1987 | D'Arrigo et al. | ............ 438/204 |
| 5,144,403 A | * | 9/1992 | Chiang et al. | ............... 257/514 |
| 5,717,241 A | * | 2/1998 | Malhi et al. | ................. 257/378 |

* cited by examiner

Primary Examiner—David Nelms
Assistant Examiner—Dao H. Nguyen

(57) ABSTRACT

A Bipolar Junction Transistor (BJT) that reduces the variation in the current gain through the use of a trench pullback structure. The trench pullback structure is comprised of a trench and an active region. The trench reduces recombination in the emitter-base region through increasing the distance charge carriers must travel between the emitter and the base. The trench also reduces recombination by reducing the amount of interfacial traps that the electrons injected from the emitter are exposed to. Further, the trench is pulled back from the emitter allowing an active region where electrons injected from a sidewall of the emitter can contribute to the overall injected emitter current. This structure offers the same current capability and current gain as a device without the trench between the emitter and the base while reducing the current gain variation.

28 Claims, 4 Drawing Sheets

BIPOLAR JUNCTION TRANSISTOR STRUCTURE WITH IMPROVED CURRENT GAIN CHARACTERISTICS

1. Technical Field of the Invention

The present invention relates to the field of Bipolar Junction Transistors (BJT) and, in particular, to a structure and method for reducing current gain variations in a BJT.

2. Background of Invention

Bipolar Junction Transistors are an integral component in modem microelectronics. BJTs have better analog capabilities when compared to CMOS transistors. It is therefore highly desirable to integrate analog BJTs into CMOS processes in order to create CMOS circuits with higher performance abilities. Often, this integration is accomplished with few or no additional fabrication steps relative to the CMOS-only process. However, as CMOS processes extend into the deep sub-micron regime, it is necessary to correspondingly shrink the BJT devices. This reduction in device scale creates a variety of problems.

First, when shrinking the scale of the BJT, the distance between the emitter and the base of the BJT is reduced. This reduction in emitter-base length can lead to increased amounts of Auger recombination at the base. The current gain (beta) of the BJTs is a function of the base current. Therefore, increased amounts of Auger recombination at the base causes a reduction in the current gain.

Second, the shrinking of BJT dimensions requires that well profiles are tailored using multiple chain implants instead of long high-temperature diffusion steps. These chain implants create significant numbers of interface and bulk traps between the emitter and the base contact that facilitate recombination. This high density of interface traps, also known as surface states, within the BJT do not get annealed during subsequent processing because of low thermal budget processing. Otherwise, the whole purpose of using chain implants is defeated. These surface states lead to an increased base recombination current in the BJT. The surface state density is unpredictable, not well controlled, and is known to vary across a wafer, lot-to-lot, and facility-to-facility. Since the base current is dominated by recombination due to the presence of a high surface state density, the current gain of these devices is found to vary significantly even across a single wafer. This current gain variation, especially for analog circuits, is very undesirable. It is therefore highly desirable to develop a structure that can reduce this variation in the BJT current gain as BJTs are integrated in deep sub-micron processes.

There currently are known techniques that address this current gain variation. One such technique is through using a field oxide between the emitter and base. Through having a field oxide between the emitter and base, it is possible to significantly reduce the flow of electrons from the emitter into the base where they would recombine. In addition, the field oxide reduces the number of interface traps encountered by the injected electrons. However, this technique has its scale limits.

One other method of addressing this current gain problem is through using Shallow Trench Isolation (STI) to separate the emitter and base. This method is a natural evolution from the use of the field oxide. Just as with the field oxide, the STI significantly reduces the flow of electrons from the emitter to the base, thereby reducing recombination from Auger processes and interface traps.

In addition, both the field oxide and STI solutions create new problems. In both field oxide and STI designs, the isolation between the base and emitter extends all the way to the edge of the emitter. Both the field oxide and the STI block a sidewall of the emitter. Consequently, the field oxide and STI reduce the surface area of the emitter that can inject electrons into the base. As a result, fewer electrons are injected into the base and the drive current capabilities of the BJT are reduced.

Another method of reducing the current gain problems created by device shrinkage is disclosed in T. Terashima et al, Multi-Voltage Device Integration Technique for 0.5 $\mu$m BiCMOS & DMOS Process, Proceedings of the ISPSD 2000 Conference, Toulouse, France, pp. 331–334, (May 2000). Terashima et al discloses an across-wafer current gain variation of 50 to 95 for an NPN BJT. The cause of this current gain variation is attributed to a high interface state density that did not get fully annealed. The disclosed solution was to implement a p+ base ring completely surrounding the emitter with a set spacing between the emitter n+ region and base p+ ring. This solution reduces current gain variation only for a spacing of 0.5 $\mu$m or less. However, this solution still has a fairly high current gain variation, approximately 70 to 90, across the wafer. This current gain variation presents problems as devices are reduced in scale.

Despite the above solutions, there is a continuing need to develop new structures to reduce the current gain variation in BJTs as devices are integrated into sub-micron processes.

SUMMARY OF INVENTION

A preferred embodiment of the present invention utilizes a trench pullback positioned between the emitter and base to reduce the current gain variation. This structure reduces the current gain variation by limiting recombination. In addition, this structure takes advantage of the lateral component of the emitter current, allowing it to contribute to the current gain of the device. More specifically, the trench pullback is comprised of a trench and an active region. The trench is positioned next to the base and extends partially toward the emitter. The trench in effect is pulled back from the emitter leaving an active region. The area between the emitter and the trench is the active region.

There are two primary forms of recombination that occur between the base contact and the emitter in the BJT. The first is Auger recombination that occurs at the base contact due to the lateral electron current injected by the emitter. The second is Shockley-Read-Hall (SRH) recombination that occurs at interface traps formed at the surface of the BJT between the base and the emitter. There is also SRH recombination in the bulk. However, the SRH recombination at the surface states is the dominant process. As the base injects holes into the emitter region and the emitter injects electrons into the base region, these interface states facilitate recombination.

The shrinkage of BJT dimensions into the sub-micron region exacerbates these recombination problems. Bringing the base and the emitter closer together increases the amount of Auger recombination. Sub-micron processes prevent the use of thermal annealing that reduces surface and bulk states. Further, sub-micron processes require the use of chain implants that generate significant numbers of surface states. The trench pullback of the present invention addresses these problems.

First, the presence of the trench increases the physical distance that electrons injected from the emitter must travel to reach the base contact. This increase in distance thereby reduces the amount of Auger recombination. In addition, the presence of the trench reduces the interaction of the injected electrons with the interface states. The trench occupies much of the space between the base and the emitter thereby reducing the number of surface states that these injected electrons encounter. The remaining surface states that the injected electrons are exposed to are in the active region. The trench structure has further benefits that reduce the amount of recombination that occurs at these remaining interface states in the active region. The trench also increases the distance that holes injected by the base must travel in order to reach these interface traps. Recombination at these interface states occurs when electrons and holes reach the trap. Through increasing the distance that the holes must travel to reach these interface traps, the trench reduces the occurrence of recombination at the remaining interface states in the active region.

Through reducing the recombination due to Auger processes and interface traps, the base current is reduced. Correspondingly, the current gain of the BJT is increased. In addition, because the effect of the recombination at the surface states is reduced, it is possible to fabricate BJTs with a specified level of gain reliably in a reproducible manner.

DETAILED DESCRIPTION

Figure 1:
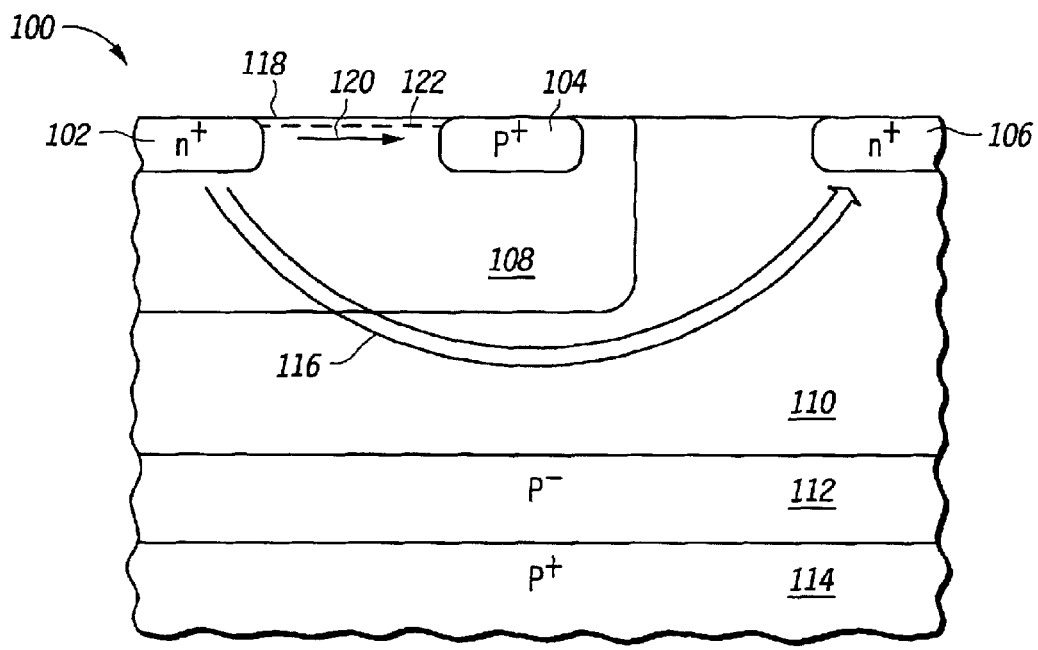
FIG. 1 illustrates a cross section of a typical BJT known to the art.

An npn BJT structure 100 known to the art is shown below in FIG. 1. BJT 100 includes an emitter 102 (n-type), a base contact 104 (p-type), and a collector contact 106 (n-type). When a forward bias is placed across emitter 102 and base contact 104, emitter 102 injects electrons into a P well 108. Ideally, all of these electrons are swept into an N 110 well where they are then collected by collector contact 106. Lightly doped highly resistive p- epilayer 112 is provided to direct the flow of electrons into collector and prevent them from flowing toward the back of a substrate 114. This ideal electron flow path is shown as path 116 in FIG. 1. While the substrate 114 is shown as a p+ layer, substrate 114 can be formed out of any substrate material. Further, while resistive p-layer 112 is shown being deposited on top of substrate 114, there are BJTs 100 that do not use a p- layer 112.

One measure of the efficiency of BJT 100 is the base transport factor. The fraction of electrons injected into P well 108 that successfully diffuse across P well 108 and enter collector contact 106 is know as the base transport factor, $\alpha_t$. The base transport factor, $\alpha_t$, given in equation 1, is a ratio of the collector electron current $I_{Cn}$ and the emitter electron current $I_{En}$. Ideally, the ratio is one, meaning that all of the electrons injected into N well 110 by emitter 102 reach collector contact 106. Put another way, reducing the loss of injected electrons via recombination due to Auger processes and surface states increases BJT 100 performance. The current gain of BJT 100 is a function of the base transport factor $\alpha_t$ and the emitter efficiency $\gamma$. The emitter efficiency $\gamma$, given in equation 2, is the ratio of the electron-injected current from emitter 102 to the total emitter current. The electron injected current $I_{En}$ is the current that is actually useful in BJT 100. All of the current from emitter 102 is ideally due to electron injection. Consequently, $\gamma$ is ideally one. The current gain $\beta$ is given below in equation 3. The current gain of a BJT 100 is maximized when all of the electrons follow path 116 to collector contact 106. However, in an actual BJT 100, not all of the electrons flow along path 116. Recombination in the base-emitter region, 104 and 102, reduces the base transport factor $\alpha_t$ and correspondingly reduces the current gain $\beta$.

$$\alpha_t = I_{Cn}/I_{En} \qquad \text{Equation (1)}$$

$$\gamma = I_{En}/I_E \qquad \text{Equation (2)}$$

$$\beta = (\alpha_t * \gamma)/(1 - \alpha_t * \gamma) \qquad \text{Equation (3)}$$

A portion of the electrons injected from the emitter 102 flow laterally along surface 118 of BJT 100 directly toward base contact 104. This lateral flow of electrons 120 from emitter 102 to base contact 104 is shown as path 120. The lateral flow of electrons along path 120 creates an opportunity for parasitic recombination to occur.

There are several forms of recombination that prevent electrons injected from emitter 102 from reaching collector contact 106. One form of recombination that occurs is Auger recombination at base contact 104. In Auger recombination, two like carriers collide causing band to band recombination. For instance, two electrons will collide driving one electron into the valence band where it directly recombines with a hole. As electrons injected from emitter 102 flow laterally toward base contact 104, these electrons undergo Auger recombination when they reach base contact 104. Consequently, through recombination, these electrons are lost and cannot contribute to the flow of carriers into collector contact 106.

Auger recombination becomes a serious problem as BJTs 100 are reduced in size into the sub-micron region. As BJTs 100 are reduced in size, the physical distance between emitter 102 and base contact 104 is reduced. The reduction of emitter-base, 104 and 102, distance facilitates greater and greater amounts of Auger recombination.

Another form of recombination occurs due to surface states 122 that exist between emitter 102 and base contact 104. Surface states 122, often referred to as interfacial traps, are allowed energy states in which electrons are localized in the vicinity of a material's surface 118. At these allowed energy states, electrons injected from emitter 102 undergo SRH recombination with holes that are injected from base contact 104. One method of reducing interfacial traps 122 is through a high temperature thermal anneal process. In BJT devices 100 that are manufactured on a scale larger than sub-micron dimensions, emitter 102, base contact 104, and collector contact 106 regions are usually formed using a thermal diffusion process. This thermal process reduces the number of interfacial traps 122 present at surface 118 of BJT 100 between emitter 102 and base contact 104. However, in BJT devices 100 manufactured at sub-micron dimensions, emitter 102, base contact 104 and collector contact 106 are typically formed using counter-doped chain implants.

Chain implants allow for the formation of sub-micron dimension BJTs 100. However, these chain implants also create a high density of surface states 122 between emitter 102 and base contact 104. It is not possible to then remove these surface states 122 with a high temperature annealing process because it would cause doped emitter 102, base contact 104, and collector contact 106 regions to diffuse past their desired geometry. High temperature annealing would defeat the whole purpose of using a chain, high energy implant process in the first place.

One of the primary objectives in the fabrication of semiconductor devices is reproducibility. It is critical that a manufacturing process produce devices that fall within specific performance parameters identically wafer after wafer in facility after facility. Not only do interfacial states 122 increase recombination within BJT 100, the amount of interfacial states 122 varies greatly in the fabrication process. The amount of interfacial states fabricated in a sub-micron process will vary across a single wafer, wafer-to-wafer, and facility-to-facility. This variability in interfacial states causes a variation in the current gain in manufactured BJTs 100. Consequently, these interfacial states are significant obstacle to reproducing identical BJT devices 100 falling within a desired tolerance level.

To summarize, the shrinkage of device geometry is driving the increase in recombination due to Auger processes. The use of chain implants to form devices is driving the increase in recombination due to increased numbers of surface states 122. These recombination processes reduce the amount of electrons injected from emitter 102 from reaching collector contact 106. Consequently, the current gain BJT 100 is reduced.

Figure 2:
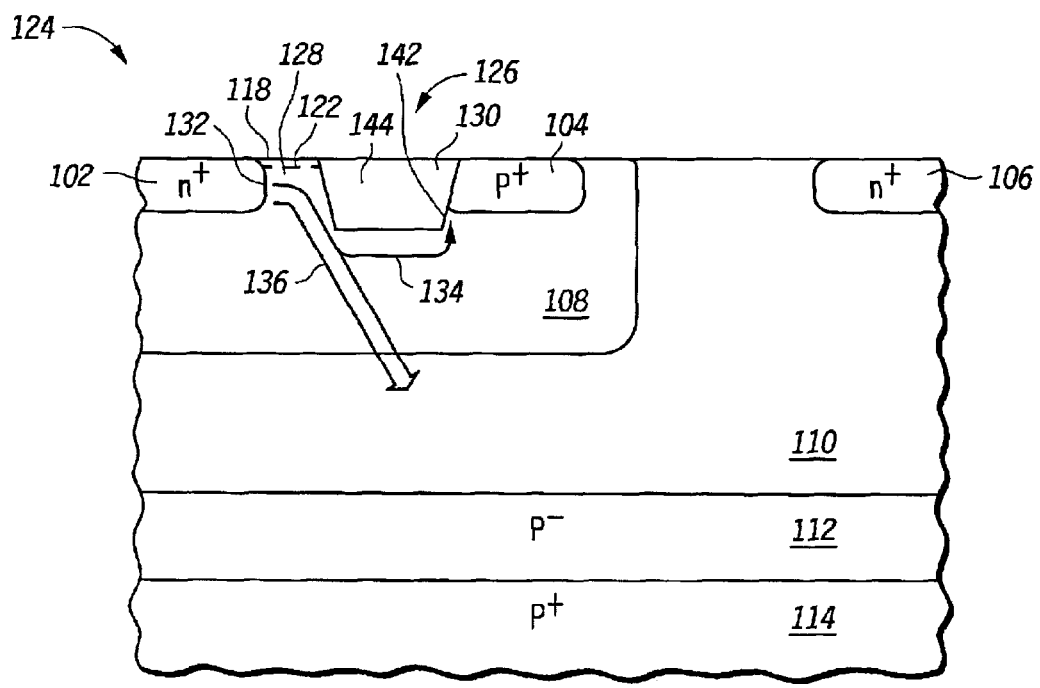
FIG. 2 illustrates a preferred embodiment of the BJT of the present invention.

It is possible to reduce these forms of recombination through employing a present embodiment of the invention. FIG. 2 shows a cross section of a preferred embodiment of BJT 124. BJT 124 shown in FIG. 2 is an npn transistor. The general structure of BJT 124 includes a p+ substrate 114 that provides mechanical support for BJT 124. On top of substrate 114, a highly resistive and lightly doped p– type epilayer 112 is deposited. Multiple chain implants are used to from N well 110. Using a p type dopant, the chain implant procedure is repeated to form P well 108. A p+ implant process is then used to form p+ base contact 104. Similarly, an n+ implant process is used to form n+ collector contact 106 and emitter 102. While the substrate 114 is shown as a p+ layer, substrate 114 can be formed out of any substrate material. Further, while resistive p–layer 112 is shown being deposited on top of substrate 114, there are BJTs 100 that do not use a p– layer 112.

The structure that reduces the occurrence of parasitic recombination is a trench pullback 126 positioned between base contact 104 and emitter 102. With reference to FIG. 2, the trench pullback 126 impacts the flow of electrons from emitter 102 to collector contact 106 in several ways. Trench pullback 126 is comprised of an active region 128 and a trench 130. The presence of trench 130 increases the distance that electrons injected from sidewall 132 of emitter 102 must travel toward base contact 104. Comparing path 120 in FIG. 1 to path 134 in FIG. 2, the distance of path 134 is greater. Through increasing the distance that electrons must travel, trench 130 reduces the number of electrons that reach base contact 104 and undergo Auger recombination. This reduction in Auger recombination consequently increases the current gain of BJT 124. In addition, it also improves the variation in current gain.

While trench 130 is shown to lie next to base contact 104, it is possible to also pullback trench 130 from base contact 104 just as trench 130 is pulledback from emitter 102. Pulling back trench 130 from base contact 104 would create an active region between trench 130 and base contact 104.

The amount of drive current BJT 124 is capable of depends upon the amount of electrons emitter 102 can inject into P well 108. If trench 130 extended all of the way toward sidewall 132 of emitter 102, sidewall 132 of emitter 102 could not inject electrons into P well 108, thereby reducing BJTs 124 drive current capability. If trench 130 extended against emitter 102, the surface area of emitter 102 would be reduced, thereby reducing the amount of electrons it could inject into P well 108. However, through pulling trench 130 back to form an active region 128, sidewall 132 of emitter 102 can still inject carriers into P well 108. Trench pullback 126 permits sidewall 132 injection of electrons, thereby increasing the drive current capability of BJT 124. The electrons that are injected from sidewall 132 into active region 128 are then directed in a path 136 toward N well 120 by trench 130. Through directing the electrons injected by emitter 102 sidewall 132 into N well 110, trench 130 reduces the number of electrons that reach base contact 104 and undergo Auger recombination.

The presence of trench 130 also reduces the amount of recombination that occurs due to surface states 122. Physically, trench 130 reduces the amount of surface area 118 that the electrons encounter as they are injected from emitter 102 into P well 108. Without trench 130, there are surface states 122 along the entire surface 118 between emitter 102 and base contact 104 where electrons injected from sidewall 132 can recombine. However, trench 130 limits the surface area 118 encountered by electrons to that surface area 118 in the active region 128. Further, recombination in a surface state 122 occurs when electrons and holes are present. The presence of trench 130 inhibits the ability of holes injected from base contact 104 into P well 108 to reach the interface states 122 present in active region 128. Trench 130 inhibits the flow of holes through increasing the physical distance that the holes must travel. The holes must flow back along path 134 in contrast to back along path 120 in FIG. 1. Therefore, even though there are remaining surface states 122 in active region 128, the ability of these states 122 to facilitate recombination is reduced because the number of holes that can travel to these states 122 is reduced by the presence of trench 130.

Through reducing the amount of recombination due to surface states, trench 130 reduces the variation in the current gain of BJTs 124. It therefore becomes possible to fabricate BJTs 124 at the sub-micron level with an acceptable tolerance range for the current gain with the use of trench pullback structure 126.

Figure 3:
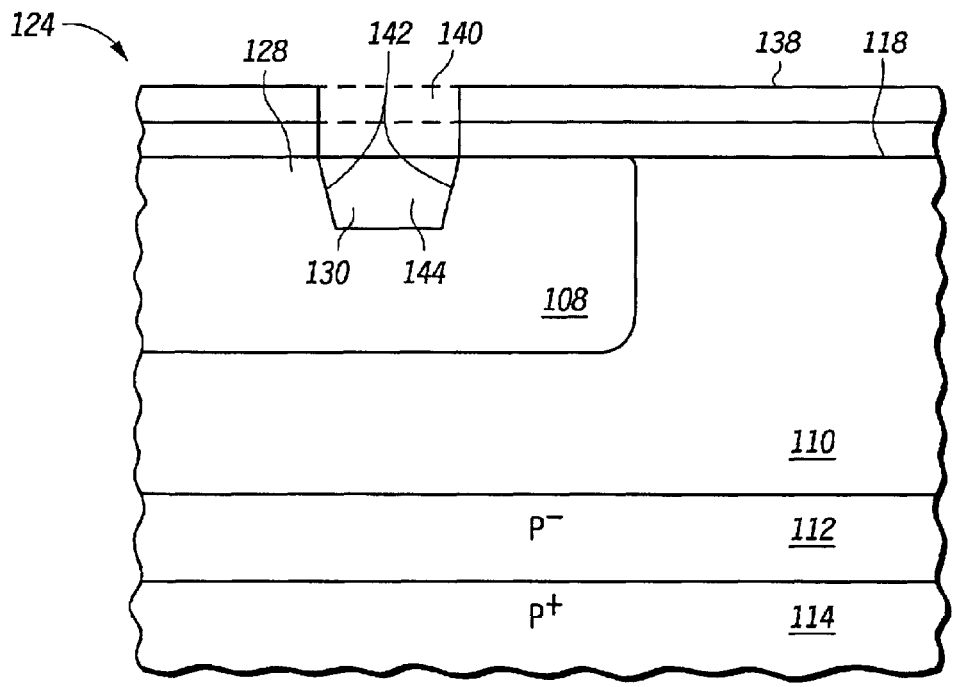
FIG. 3 depicts a preferred embodiment of the present invention at the formation of the trench stage of fabrication.

FIG. 3 depicts the formation of trench pullback structure 126 fabricated in accordance with a preferred embodiment of the present invention. Referring to FIG. 3, trench 130 is usually, but not necessarily formed through depositing an oxide/nitride layer 138 is on the top surface 118 of BJT 124 to protect BJT 124 from the following Reactive Ion Etch process (RIE). The oxide/nitride layer 138 is a hard mask. As an alternative to using a hard mask 138, a resist mask 138 can be used. A photolithographic process opens a window 140 (shown in dashed lines) in oxide/nitride layer 138 for the formation of trench 130. The RIE process then forms trench 130. The oxide/nitride layer 138 is then stripped from surface 118 of BJT 124. This etching process also creates surface states long sidewalls 142 of trench 130. However, a thermal side-wall oxidation reduces the dangling crystalline bonds that produce these surface states. In a preferred embodiment, a dielectric material 144 is then deposited in trench 130. However, in an alternative embodiment, polysilicon is deposited in trench 130 in place of the dielectric material 144. In addition, it is also possible to fill trench 130 with other conductive materials or semi-conductive materials.

Figure 4:
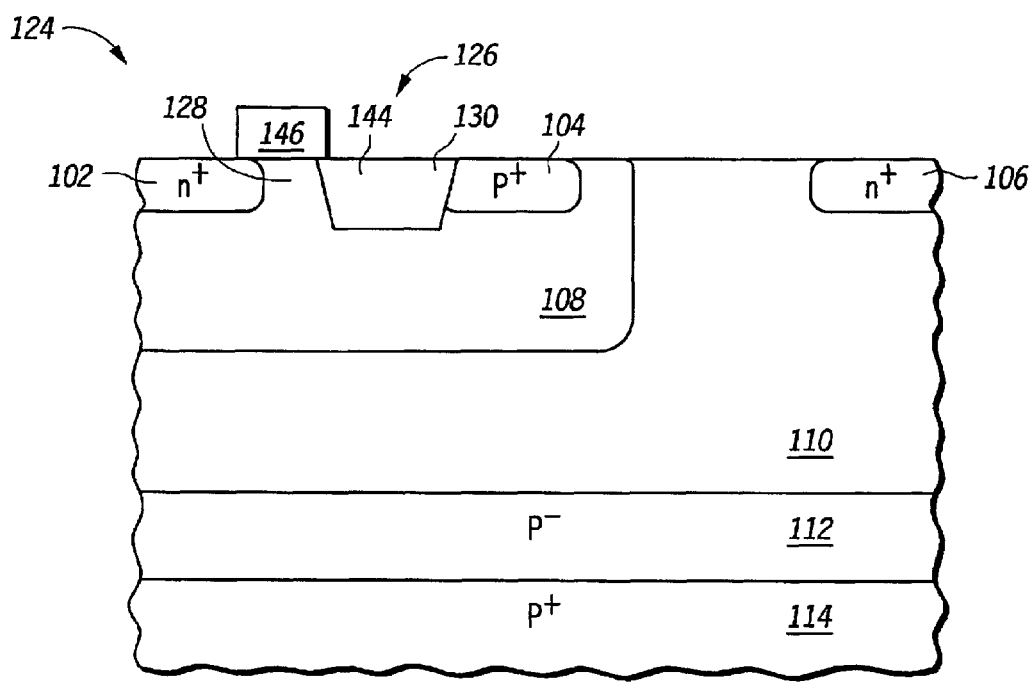
FIG. 4 depicts a salicide block in a BJT fabricated in accordance with a preferred embodiment of the present invention.

FIG. 4 depicts a salicide block 146 positioned in BJT 124 fabricated in accordance with a preferred embodiment of the present invention. As shown in FIG. 4, salicide block 146 may be formed on the top surface 118 of BJT 124 extending between emitter 102 and trench 130 depending upon the processes used. For a high quality, high performance BJT device 124, salicides are used to form contacts with emitter 102, base contact 104, and collector contact 106. Salicides are used to improve contact resistance and reduce spiking, shorting, and junction leakage. Salicide block 146 is a physical barrier to the formation of the salicide to restrict its growth to over emitter 102 and over base contact 104. However, for inexpensive low performance BJT devices 124, salicides are not used to form contacts. Therefore, salicide block 146 is not required for low performance BJT devices 124.

Figure 5:
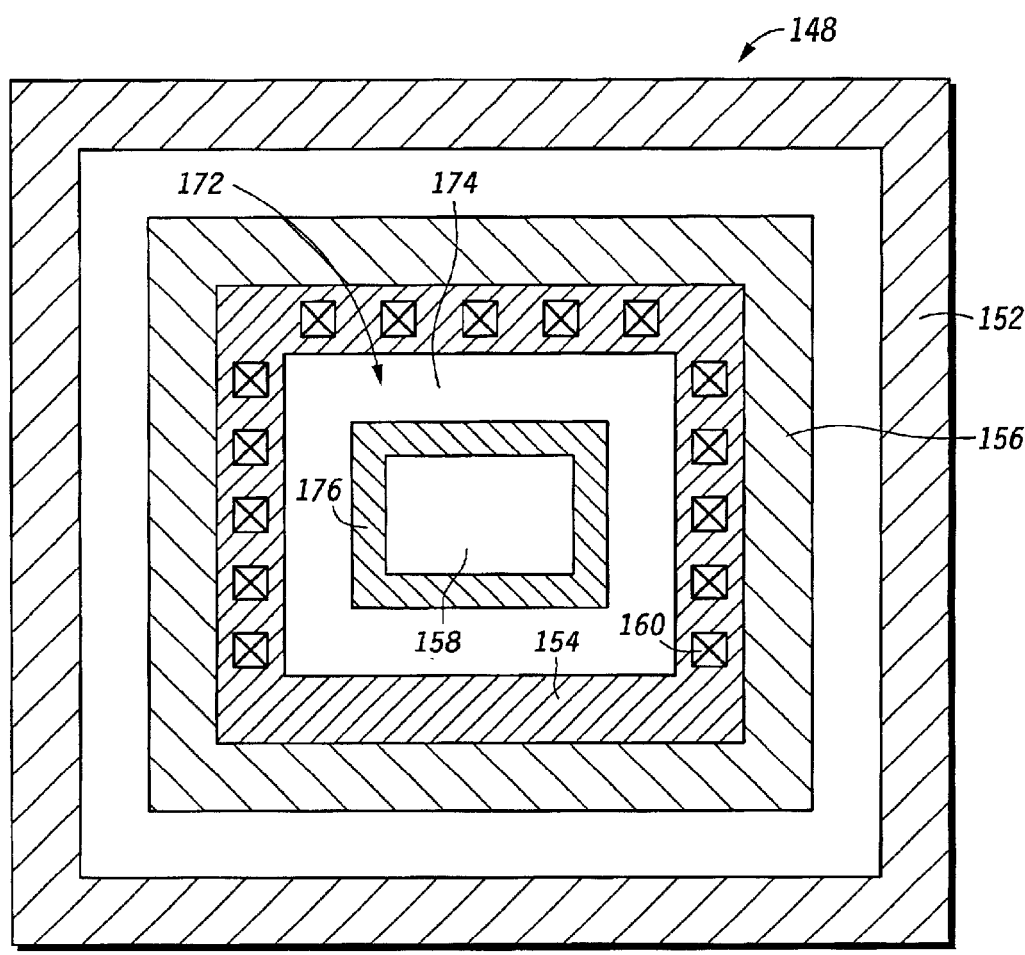
FIG. 5 depicts a standard layout for a BJT fabricated in accordance with a preferred embodiment of the present invention.
Figure 6:
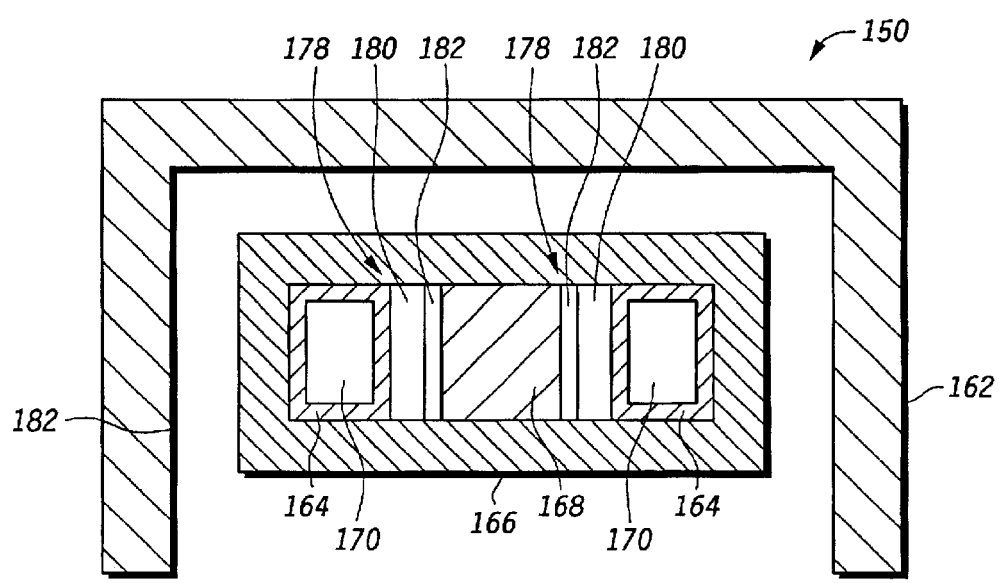
FIG. 6 shows a non-standard layout for a BJT fabricated in accordance with a preferred embodiment of the present invention.

FIG. 5 depicts a standard layout for a BJT fabricated in accordance with a preferred embodiment of the present invention. FIG. 6 shows a non-standard layout for a BJT fabricated in accordance with a preferred embodiment of the present invention. Trench pullback structure 126 can be used with a Standard Layout (SL) BJT 148 shown in FIG. 5, or a Non-Standard layout (NS) BJT 150 shown in FIG. 6. SL BJT 148 is formed in a series of rings. SL BJT 148 has an n+ collector 152, a p+ base 154, a base well 156, an emitter 158, and a series of base contacts 160. NS BJT 150 has an n+ collector 162, a p+ base 164, a base well 166, an n+ emitter 168, and two base contacts 170. As seen in FIGS. 5 and 6, there is a greater amount of surface area between emitter and base in SL BJT 148 than in NS BJT layout 150. Consequently, recombination due to Auger processes and interface states is a greater problem in SL BJTs 148 than NS BJTs 150. As a result, there is greater current gain variation in SL BJTs 148 than NS BJTs 150.

Referring to FIG. 5, trench pullback 172, comprised of trench 174 and active region 176, is shown between emitter 158 and base 154 rings. As with the trench pullback 126 in BJT 124, trench pullback 172 in SL BJT 148 reduces the amount of recombination due to Auger processes and interface traps. Trench 174 increases the distance that electrons injected from emitter 158 must travel to reach the base ring 154. Consequently, the recombination of electrons at base 154 due to Auger processes is reduced. As a result, the base current and variation is reduced. Correspondingly, the current gain of the BJT is increased. In addition, trench 174 occupies a large amount of the surface area between base ring 154 and emitter 158 where surface states exist. Since trench 174 occupies this area, the electrons injected from emitter 176 interact with far fewer of these surface states. Only those surface states in the active region 176 can facilitate recombination. Consequently, the amount of recombination that occurs at these states is reduced and limited to those states in active region 176. Further, the trench increases the distance that holes injected from base ring 154 must travel to reach the remaining surface states in active region 176. Due to the increased distance the holes must travel to reach the surface states in active region 176, the amount of recombination at active region 176 surface states is further reduced. Since the effect of the recombination at the surface states is reduced, the variation in the current gain is also reduced. Still further, active region 176 allows for the recovery of the sidewall injected electron current from emitter 158. This recovery of the sidewall current improves the drive current capability and current gain of SL BJT 148.

Referring to FIG. 6, trench pullback 178, comprised of trench 180 and active region 182, is shown between base 164 and emitter 168. Following the discussion for SL BJT 148, trench pullback structure 178 similarly reduces the recombination due to Auger processes and surface states in NS BJT 150. This reduction in recombination increases the current gain while reducing the variation in the current gain. Also, active region 182 allows the sidewall injected electron current from emitter 168 to contribute to the useful injected electron current from emitter 168, thereby increasing NS BJT 150 drive current ability and current gain.

Figure 7:
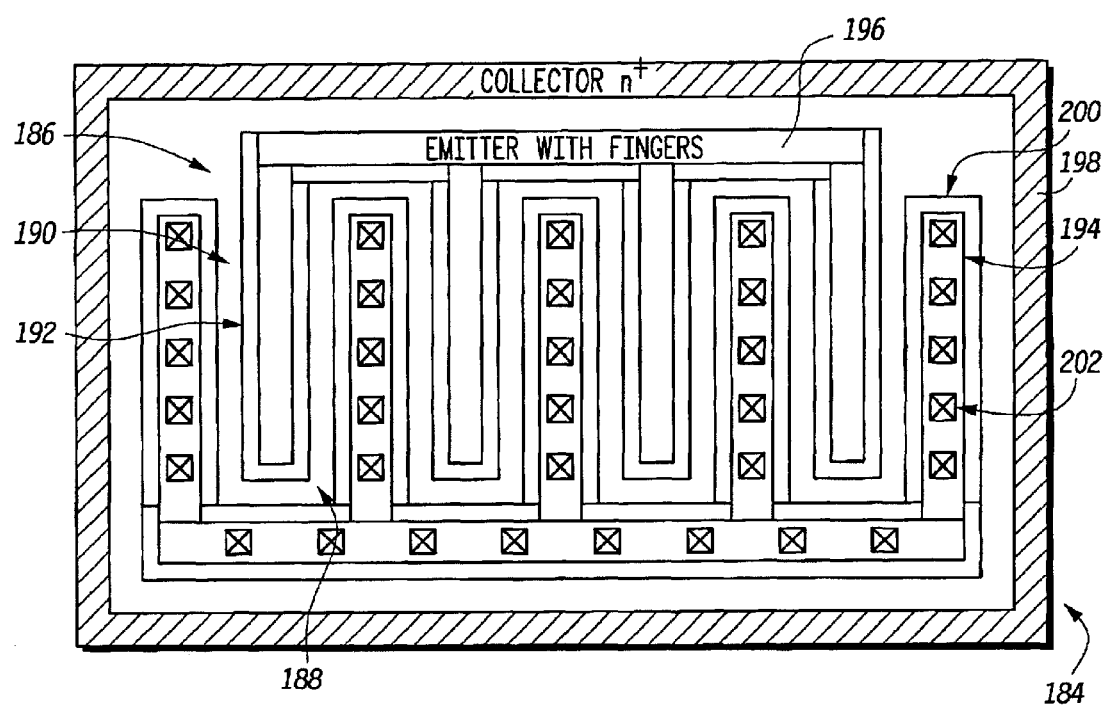
FIG. 7 illustrates an RF BJT layout fabricated in accordance with a preferred embodiment of the present invention.

In high performance RF (radio-frequency) applications, BJTs 184 have an interleaved emitter-base structure 186 shown below in FIG. 7. As with the previous BJT structures, trench pullback 188, comprised of trench 190 and active region 192, can be positioned between base 194 and emitter 196 to reduce the amount of recombination that occurs due to Auger processes and interface traps. Trench 190 increases the distance that electrons injected from emitter 196 must travel to reach base 194. Consequently, the recombination of electrons at the base due to Auger processes is reduced. As a result, the base current is reduced. Correspondingly, the current gain of BJT 184 is increased and variation suppressed.

In addition, trench 190 occupies a large percentage of the surface area between base 194 and emitter 196 where surface states exist. Since trench 190 occupies this area, the electrons injected from emitter 196 interact with far fewer of these surface states. Only those surface states in active region 192 can facilitate recombination. Consequently, the amount of recombination that occurs at these states is reduced and limited to those states in active region 192. Further, trench 190 increases the distance that holes injected from base 194 must travel to reach the remaining surface states in active region 192. Due to the increased distance the holes must travel to reach the surface states in active region 192, the amount of recombination at active region 192 surface states is further reduced. Since the effect of the recombination at the surface states is reduced, the variation in the current gain is also reduced. Still further, active region 192 allows for the recovery of the sidewall injected electron current from emitter 196. This recovery of the sidewall current improves the drive current capability and current gain of RF BJT 184.

The above description of the preferred embodiment detailed the use of trench pullback 126 with a npn transistor. However, the trench pullback of the preferred embodiment can similarly reduce the parasitic recombination that occurs due to Auger processes and interface traps in a pnp BJT transistor. As with the npn transistor, the trench pullback of the present invention operates to increase the distance that holes must travel between a p-type emitter and an n-type base in a pnp transistor without increasing device surface area. Through increasing the distance, the trench thereby reduces the Auger recombination that occurs at the base. As a result, the base current is reduced and the current gain is increased and variation suppressed.

In addition, the trench occupies a large percentage of the surface area between the n-type base and the p-type emitter where surface states exist. Since the trench occupies this area, the holes injected from the p-type emitter interact with far fewer of these surface states. Only those surface states in the active region between the p-type emitter and the trench can facilitate recombination. Consequently, the amount of recombination that occurs at these states is reduced and limited to those states in the active region. Further, the trench increases the distance that electrons injected from the n-type base must travel to reach the remaining surface states in the active region. Due to the increased distance that the electrons from the n-type base must travel to reach the surface states in the active region, the amount of recombination at the active region surface states is further reduced. Since the effect of the recombination at the surface states is reduced, the variation in the current gain is also reduced.

Still further, the active region allows for the recovery of the sidewall injected hole current from the p-type emitter. This recovery of the sidewall current improves the drive current capability and current gain of the pnp transistor.

Although the present invention has been described in detail, it will be apparent to those of skill in the art that the invention may be embodied in a variety of specific forms and that various changes, substitutions, and alterations can be made without departing from the spirit and scope of the invention. The described embodiments are only illustrative and not restrictive and the scope of the invention is, therefore, indicated by the following claims.

We claim:

1. A bipolar junction transistor, comprising:
   a trench, said trench positioned next to a base and at least partially in a region between an emitter and a collector, said trench extending partially toward said emitter, said trench occupies an area of a surface of said bipolar junction transistor between said emitter and said base; and
   an active region extending from said trench to said emitter.

2. The bipolar junction transistor of claim 1, wherein said trench has an oxidized sidewall.

3. The bipolar junction transistor of claim 2, further comprising a salicide block extending above and in direct contact with said active region within an area between said emitter and said collector.

4. The blpolar junction transistor of claim 3, wherein a dielectric material is deposited in said trench.

5. The bipolar junction transistor of claim 3, wherein a conductive material is deposited in said trench.

6. The bipolar junction transistor of claim 3, wherein a semi-conductive material is deposited in said trench.

7. A bipolar junction transistor, comprised of;
   trench means to increase a distance that a charge carrier must travel between an emitter and a base contact, said trench means positioned between said base contact and said emitter and between said emitter and a collector, said trench means occupies an area of a surface of said bipolar junction transistor between said emitter and said base; and
   active region means to enable an electron Injected from a sidewall of said emitter to flow toward a collector.

8. The bipolar junction transistor of claim 7, wherein a side-wall of said trench means is oxidized.

9. The bipolar junction transistor of claim 8, further comprising a salicide block means extending above said active region means to block formation of a salicide over said active region means within an area between said emitter and said collector.

10. The bipolar junction transistor of claim 9, wherein a dielectric material is deposited in said trench means.

11. The bipolar junction transistor of claim 9, wherein a conductive material is deposited in said trench means.

12. The bipolar junction transistor of claim 9, wherein a semi-conductive material is deposited in said trench means.

13. A bipolar junction transistor, comprised of;
    trench means to reduce recombination of a plurality of charge carriers in an emitter-base region; and
    active region means to enable an electron injected from a sidewall of said emitter to flow toward a collector.

14. The bipolar junction transistor of claim 13, wherein a side-wall of said trench means is oxidized.

15. The bipolar junction transistor of claim 14, further comprising a salicide block means extending above said emitter and said trench to block formation of a salicide over said active region means.

16. The bipolar junction transistor of claim 15, wherein a dielectric material is deposited in said trench means.

17. The bipolar Junction transistor of claim 15, wherein a conductive material is deposited in said trench means.

18. The bipolar junction transistor of claim 15, wherein a semi-conductive material is deposited in said trench means.

19. A vertical bipolar transistor, comprising:
    a trench, said trench positioned next to a base, said trench extending partially toward an emitter; and
    an active region separating said trench from said emitter and extending from said trench to said emitter.

20. The bipolar junction transistor of claim 19, wherein said trench has an oxidized sidewall.

21. The bipolar junction transistor of claim 20, further comprising a salicide block extending above said active region within an area between said emitter and said collector.

22. The bipolar junction transistor of claim 21, wherein a dielectric material is deposited in said trench.

23. The bipolar junction transistor of claim 21, wherein a conductive material is deposited in said trench.

24. The bipolar junction transistor of claim 21, wherein a semi-conductive material is deposited in said trench.

25. A bipolar junction transistor, comprising:
    an etched trench positioned next to a base contact and extending partially toward an emitter contact, said etched trench occupies an area of a surface of said bipolar junction transistor between said emitter contact and said base contact; and
    an active region extending laterally from a sidewall of said etched trench and separating the etched trench from the emitter contact.

26. The bipolar junction transistor of claim 25, whereby said etched trench reduces the number of surface states created by a chain implant process between said emitter contact and said base contact, thereby reducing the fluctuation of a current gain of said bipolar junction transistor.

27. The bipolar junction transistor of claim 25, wherein said base contact is created through a chain implant process, said chain implant process creates a plurality of surface states between said emitter contact and said base contact, whereby forming said etched trench removes a portion of said plurality of surface states, thereby reducing the fluctuation of a current gain of said bipolar junction transistor.

28. The bipolar junction transistor of claim 25, wherein said trench directs carriers injected by a sidewall of said emitter contact away from a base contact down into a collector well, thereby reducing recombination at said base contact.

* * * * *